(12) United States Patent
Cho et al.

(10) Patent No.: US 12,295,159 B2
(45) Date of Patent: May 6, 2025

(54) SUPERJUNCTION SEMICONDUCTOR DEVICE WITH DIFFERENT EFFECTIVE EPITAXIAL LAYER THICKNESSES

(71) Applicant: DB HiTek Co., Ltd., Bucheon-si (KR)

(72) Inventors: Won Kook Cho, Bucheon-si (KR); Myeong Bum Pyun, Incheon (KR)

(73) Assignee: DB HiTek Co., Ltd., Bucheon-si (KR)

( * ) Notice: Subject to any disclaimer, the term of this patent is extended or adjusted under 35 U.S.C. 154(b) by 550 days.

(21) Appl. No.: 17/584,832

(22) Filed: Jan. 26, 2022

(65) Prior Publication Data

US 2022/0285487 A1    Sep. 8, 2022

(30) Foreign Application Priority Data

Mar. 3, 2021  (KR) .................. 10-2021-0027819

(51) Int. Cl.
| | | |
|---|---|---|
| *H10D 62/10* | (2025.01) | |
| *H10D 30/01* | (2025.01) | |
| *H10D 30/66* | (2025.01) | |
| *H10D 62/17* | (2025.01) | |

(52) U.S. Cl.
CPC ....... *H10D 62/111* (2025.01); *H10D 30/0291* (2025.01); *H10D 30/665* (2025.01); *H10D 62/104* (2025.01); *H10D 62/105* (2025.01); *H10D 62/393* (2025.01)

(58) Field of Classification Search
CPC .............. H01L 29/7802–7815; H01L 29/66712–66734; H01L 29/7395–7398; H01L 29/66333–66348; H01L 29/0611–0634; H01L 29/0661; H01L 29/7811; H10D 30/66–669; H10D 30/0291–0297; H10D 62/103–111
See application file for complete search history.

(56) References Cited

U.S. PATENT DOCUMENTS

| | | | |
|---|---|---|---|
| 7,301,203 B2 | 11/2007 | Lee et al. | |
| 7,655,981 B2 | 2/2010 | Lee et al. | |
| 2001/0015170 A1 | 8/2001 | Kitabatake | |
| 2005/0116313 A1 | 6/2005 | Lee et al. | |
| 2006/0208334 A1* | 9/2006 | Yamauchi | H01L 29/0634 257/E29.066 |
| 2008/0211053 A1 | 9/2008 | Lee et al. | |
| 2015/0115286 A1* | 4/2015 | Takeuchi | H01L 29/158 257/77 |
| 2017/0338301 A1* | 11/2017 | Hu | H01L 29/0634 |

(Continued)

FOREIGN PATENT DOCUMENTS

| | | |
|---|---|---|
| KR | 10-0192164 B1 | 6/1999 |
| KR | 10-2005-0052597 A | 6/2005 |

(Continued)

*Primary Examiner* — Younes Boulghassoul
(74) *Attorney, Agent, or Firm* — Andrew D. Fortney; Central California IP Group, P.C.

(57) ABSTRACT

A superjunction semiconductor device with an epitaxial layer having different effective thicknesses and a method of manufacturing the same are disclosed. The superjunction semiconductor device includes an epitaxial layer having different thicknesses in a cell region and a ring region to decrease a breakdown voltage of the cell region relative to a breakdown voltage of the ring region so as to reveal a characteristic of the breakdown voltage of the cell region.

7 Claims, 8 Drawing Sheets

(56) References Cited

U.S. PATENT DOCUMENTS

| | | | |
|---|---|---|---|
| 2018/0040690 A1* | 2/2018 | Kobayashi | H01L 29/66068 |
| 2018/0069115 A1* | 3/2018 | Sugai | H01L 29/0688 |
| 2019/0043982 A1* | 2/2019 | Finney | H01L 29/063 |
| 2020/0119187 A1* | 4/2020 | Arai | H01L 29/32 |
| 2020/0168732 A1* | 5/2020 | Mitani | H01L 29/0619 |
| 2021/0167167 A1* | 6/2021 | Kawada | H01L 29/1095 |
| 2021/0296437 A1* | 9/2021 | Lee | H01L 29/7811 |
| 2023/0038806 A1* | 2/2023 | Kouno | H01L 29/0634 |
| 2023/0050319 A1* | 2/2023 | Baba | H01L 29/402 |
| 2023/0246102 A1* | 8/2023 | Kumagai | H01L 29/66477 257/341 |

FOREIGN PATENT DOCUMENTS

| | | |
|---|---|---|
| KR | 10-2008-0092406 A | 10/2008 |
| KR | 10-2017-0022418 A | 3/2017 |

\* cited by examiner

SUPERJUNCTION SEMICONDUCTOR DEVICE WITH DIFFERENT EFFECTIVE EPITAXIAL LAYER THICKNESSES

CROSS REFERENCE TO RELATED APPLICATION(S)

The present application claims priority to Korean Patent Application No. 10-2021-0027819, filed Mar. 3, 2021, the entire contents of which are incorporated herein for all purposes by this reference.

BACKGROUND OF THE INVENTION

Field of the Invention

The present disclosure relates to a superjunction semiconductor device with a differential effective thickness and a method of manufacturing the same and, more particularly, to a superjunction semiconductor device and a method of manufacturing the same, the superjunction semiconductor device being configured to have different thicknesses of an epitaxial layer in a cell region and in a ring region, to decrease a breakdown voltage in the cell region relative to the breakdown voltage in the ring region, and optionally allow the breakdown voltage in the cell region to control switching in the device.

Description of the Related Art

In order to improve the high voltage characteristics of high voltage power MOSFETs, a specific resistance and thickness of a drift region must be increased to increase a breakdown voltage. Since the breakdown voltage is proportional to on-resistance, the on-resistance increases as the breakdown voltage increases.

In order to solve the above problem, a superjunction power MOSFET was introduced in which p-type regions and n-type regions alternate below an activation region. The alternating p-type and n-type regions are ideal for charge balancing, so that the regions deplete each other under a reverse voltage condition, and the superjunction power MOSFET may be more resistant to breakdown. Accordingly, a stripe P pillar type superjunction power MOSFET, which has high voltage characteristics and low on-resistance characteristics compared to prior planar power MOSFETs, are increasingly being used.

Figure 1:
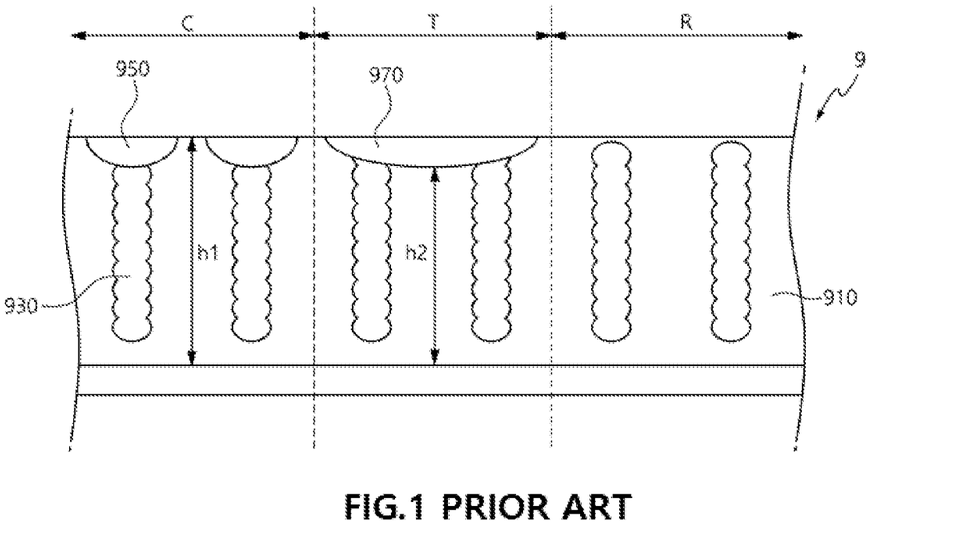
FIG. 1 is a cross-sectional view of a conventional superjunction semiconductor device.
Figure 2:
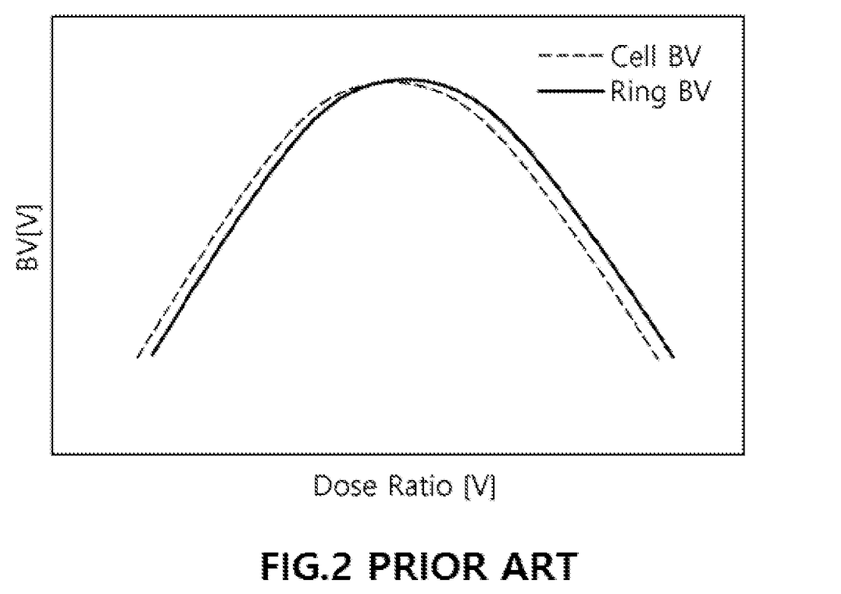
FIG. 2 is a graph showing breakdown voltages in a cell region and a ring region according to the dose ratio in the conventional superjunction semiconductor device shown in FIG. 1.

FIG. 1 is a cross-sectional view showing a conventional superjunction semiconductor device. FIG. 2 is a graph showing breakdown voltages in the cell region and the ring region according to the dose ratio in the superjunction semiconductor device shown in FIG. 1.

Referring to FIG. 1, the conventional superjunction semiconductor device 9 the epitaxial layer 910 has a uniform thickness over the cell region C, the transition region T, and the ring region R. The first body regions 950 in the cell region C are connected to the pillars 930 in a one-to-one matching relationship, and a second body region 970 in the transition region T has a long shape in a transversal direction to connect the pillars 930 to each other. The pillars 930 in the transition region T share the second body region 970 together. Therefore, an effective thickness h2 of the epitaxial layer 910 in the transition region T is smaller in comparison to an effective thickness h1 of the epitaxial layer 910 in the cell region C.

In general, in the superjunction device, the breakdown voltage is determined by characteristics of the epitaxial layer 910 and the pillars 930, and unclamped inductive switching (UIS) may be stable when it is determined in the cell region C, which has a relatively larger area and provides the current path. However, as shown in FIG. 2, when the breakdown voltage in the cell region and the breakdown voltage in the ring region are similar, variations in the breakdown voltage in the ring region may be a factor in diminishing or weakening the UIS. The breakdown voltage in the ring region may affect the device when the effective thickness h2 of the epitaxial layer 910 in the transition region is smaller than the effective thickness h1 the epitaxial layer 910 in the cell region, thus decreasing the breakdown voltage in the ring region relative to the breakdown voltage in the cell region.

In order to solve the above problems, the inventors of the present disclosure have created a superjunction semiconductor device with a varying effective thickness in the epitaxial layer, and a method of manufacturing the same. The superjunction semiconductor device has an improved structure relative to similar or identical devices containing an epitaxial layer with a uniform thickness.

Documents of Related Art (Patent Document 1) Korean Patent Application Publication No. 10-2005-0052597 ('Superjunction semiconductor device')

SUMMARY OF THE INVENTION

Accordingly, the present disclosure has been made keeping in mind the above problems occurring in the related art, and the present disclosure is intended to provide a superjunction semiconductor device with a different effective thickness in different regions of the device and a method of manufacturing the same, the superjunction semiconductor device being configured to secure a stable breakdown voltage and stable UIS as a result of the epitaxial layer having different effective thicknesses in a cell region, a transition region, and a ring region, and increasing the breakdown voltage in the ring region.

Another objective of the present disclosure is to provide a superjunction semiconductor device with an epitaxial layer having different effective thicknesses in different regions and a method of manufacturing the same, having a structure that may be applied at a desired level without design rule restrictions and that provides different effective thicknesses of the epitaxial layer in different regions, thus increasing the breakdown voltage in the ring region relative to the breakdown voltage in the cell region.

In order to achieve the above objective, according to one aspect of the present disclosure, there is provided a superjunction semiconductor device, including a substrate; an epitaxial layer including a first epi-layer in a cell region, a second epi-layer in a transition region, and a third epi-layer in a ring region; first pillars in the cell region, second pillars in the transition region, and third pillars in the ring region, alternating with portions of the epitaxial layer; body regions in the first epi-layer and respectively connected to the first pillars; a connection region in the second epi-layer, connected to the second pillars (e.g., connecting the second pillars to each other); a gate oxide film on the first epi-layer; and a gate electrode on the gate oxide film, wherein at least part of an uppermost surface of the second epi-layer may be higher than an entire uppermost surface of the first epi-layer.

The second epi-layer may include an inclined surface extending upward from the cell region toward the ring region.

The first epi-layer may have an effective thickness less than an effective thickness of the third epi-layer.

The third epi-layer may have a substantially flat uppermost surface.

The second epi-layer may have an effective thickness substantially equivalent to the effective thickness of the first epi-layer.

In order to achieve the above objective, according to another aspect of the present disclosure, there is provided a superjunction semiconductor device, the superjunction semiconductor device including a second conductive type epitaxial layer including a first epi-layer in a cell region, a second epi-layer in a transition region, and a third epi-layer in a ring region; first conductive type pillars including first pillars in the cell region, second pillars in the transition region, and third pillars in the ring region, alternating with portions of the epitaxial layer; first conductive type body regions in the first epi-layer, respectively connected to the first pillars; and a first conductive type connection region in the second epi-layer, connected to the second pillars (e.g., connecting the second pillars to each other), wherein the first epi-layer may have a first substantially flat uppermost surface, the second epi-layer may have an inclined surface extending upward the cell region to the ring region, and the third epi-layer may have a second substantially flat uppermost surface. The entire uppermost surface of the third epi-layer may be higher than or above the entire uppermost surface of the first epi-layer. Alternatively, the first epi-layer may have a first thickness, the third epi-layer may have a second thickness greater than the first thickness, and the second epi-layer may have a third thickness that increases from a first interface with the first epi-layer to a second interface with the third epi-layer.

The superjunction semiconductor device may further include a first conductive type lightly doped well connected to the connection region in the second epi-layer, the well extending to the third epi-layer adjacent thereto.

The superjunction semiconductor device may further include a second conductive type source in each of the body regions; and a first conductive type body contact adjacent to and/or in contact with the source in each of the body regions.

The superjunction semiconductor device may further include a gate oxide film on the first epi-layer; a gate electrode on the gate oxide film; a field oxide film on the third epi-layer; and a floating gate or a floating electrode on the field oxide film.

A first effective thickness of the first epi-layer and a second effective thickness of the second epi-layer may substantially equivalent, and a third effective thickness of the third epi-layer may be greater than the first effective thickness of the first epi-layer.

In order to achieve the above objective, according to yet another aspect of the present disclosure, there is provided a method of manufacturing a superjunction semiconductor device, the method including providing an epitaxial layer on a substrate, the epitaxial layer including a first epi-layer in a cell region, a second epi-layer in a transition region, and a third epi-layer in a ring region; forming first pillars in the cell region, second pillars in the transition region, and third pillars in the ring region alternating with portions of the epitaxial layer; decreasing a height of the first epi-layer; providing a gate oxide film on the first epi-layer; and providing a gate electrode on the gate oxide film.

Decreasing the height of the first epi-layer may comprise etching (e.g., in the presence of a mask covering at least the third epi-layer), and the first epi-layer may have an effective thickness less than an effective thickness of the third epi-layer.

An inclined surface may be formed at a boundary between the first epi-layer and the second epi-layer or in an uppermost surface of the second epi-layer adjacent to the boundary, and the inclined surface may extend upward from the cell region to the ring region.

The method of manufacturing a superjunction semiconductor device may further include providing a field oxide film on the third epi-layer; and providing a floating gate or a floating electrode on the field oxide film.

The method of manufacturing a superjunction semiconductor device may further include providing a well in the second epi-layer; providing a plurality of body regions in the first epi-layer; and providing a connection region connected to the well in the second epi-layer.

The method of manufacturing a superjunction semiconductor device may further include providing a source and a body contact in each of the body regions.

In order to achieve the above objective, according to a still further aspect of the present disclosure, there is provided a method of manufacturing a superjunction semiconductor device, the method including providing a second conductive type epitaxial layer on a substrate, the epitaxial layer including a first epi-layer in a cell region, a second epi-layer in a transition region, and a third epi-layer in a ring region; forming first conductive type pillars alternating with portions of the epitaxial layer, the pillars including first pillars in the cell region, second pillars in the transition region, and third pillars in the ring region; decreasing a thickness of the first epi-layer by oxidizing the first epi-layer (e.g., in the presence of a mask covering at least the third epi-layer, to induce an interfacial change or convert part of the first and second epi-layers to a corresponding oxide); and removing an oxide formed by the oxidation process.

An uppermost surface of the first epi-layer and an uppermost surface of the third epi-layer may be substantially flat, and the second epi-layer may have one portion (e.g., an uppermost surface) extending upward from the cell region to the ring region.

The present disclosure has the following effects by the above described configurations.

The superjunction semiconductor device of the present disclosure increases the breakdown voltage in the ring region by differentiating the effective thicknesses of the epitaxial layers of the cell region, the transition region, and the ring region. Accordingly, the device can have a stable breakdown voltage and stable UIS.

The superjunction semiconductor device of the present disclosure includes different effective thicknesses of the epitaxial layer in different regions to increase the breakdown voltage in the ring region relative to the breakdown voltage of the cell region. Accordingly, the structure of the present disclosure can be applied at a desired level without design rule restrictions.

Even if effects are not explicitly mentioned in the specification, the effects described in the following specification expected by the technical characteristics of the present disclosure and potential effects thereof are treated as if the effects are described in the present specification.

BRIEF DESCRIPTION OF THE DRAWINGS

The above and other objectives, features, and other advantages of the present disclosure will be more clearly understood from the subsequent detailed description when taken in conjunction with the accompanying drawings, in which.

DETAILED DESCRIPTION OF THE INVENTION

Hereinbelow, preferred embodiments of the present disclosure will be described in detail with reference to the accompanying drawings. It should be understood that embodiments of the present invention may be changed to a variety of embodiments and the scope and spirit of the present invention are not limited to the embodiments described hereinbelow. The embodiments of the present invention described hereinbelow is only provided for allowing those skilled in the art to more clearly comprehend the present invention.

Hereinbelow, if it is described that a first component (or layer) is on a second component (or layer), it should be understood that the first component may be directly on the second component, or one or more components or layers may be between the components. Furthermore, if it is described that the first component is directly on the second component, no components are between the first and second components. A location 'on', 'upper', 'lower', 'above', and 'below' or 'beside' the first component may be used to describe a relative location relationship between the first component and another structure.

Terms such as 'a first ~', 'a second ~', and 'a third ~' are used only for the purpose for describing various elements, such as various components, regions, and/or parts, and the various elements are not limited to the terms.

It should also be noted that, in cases where certain embodiments are otherwise practicable, certain process sequences may be performed differently from those described below. For example, two processes described in succession may be performed substantially simultaneously or in a reverse order.

The term MOS (metal-oxide-semiconductor) used herein is a general term. 'M' is not limited to only metal, and may comprise any of various types of conductors. In addition, 'S' may be a substrate or a semiconductor material or structure, and 'O' is not limited to oxides, and may include various types of organic or inorganic dielectric or insulator materials.

In addition, a conductivity type or a doped region of the components may be defined as 'P-type' or 'N-type,' depending on the main carrier properties, but this is only for convenience of the description, and the technical idea of the present disclosure is not limited to a specific description. For example, 'P-type' or 'N-type' may be replaced with the more general terms 'first conductive type' or 'second conductive type'. The first conductive type may refer to P-type, and the second conductive type may refer to N-type.

A superjunction semiconductor device 1 according to an embodiment of the present disclosure includes a cell region C as an activation region, and a ring region R as a termination region enclosing the cell region C. A transition region T is between the cell region C and the ring region R.

Figure 3:
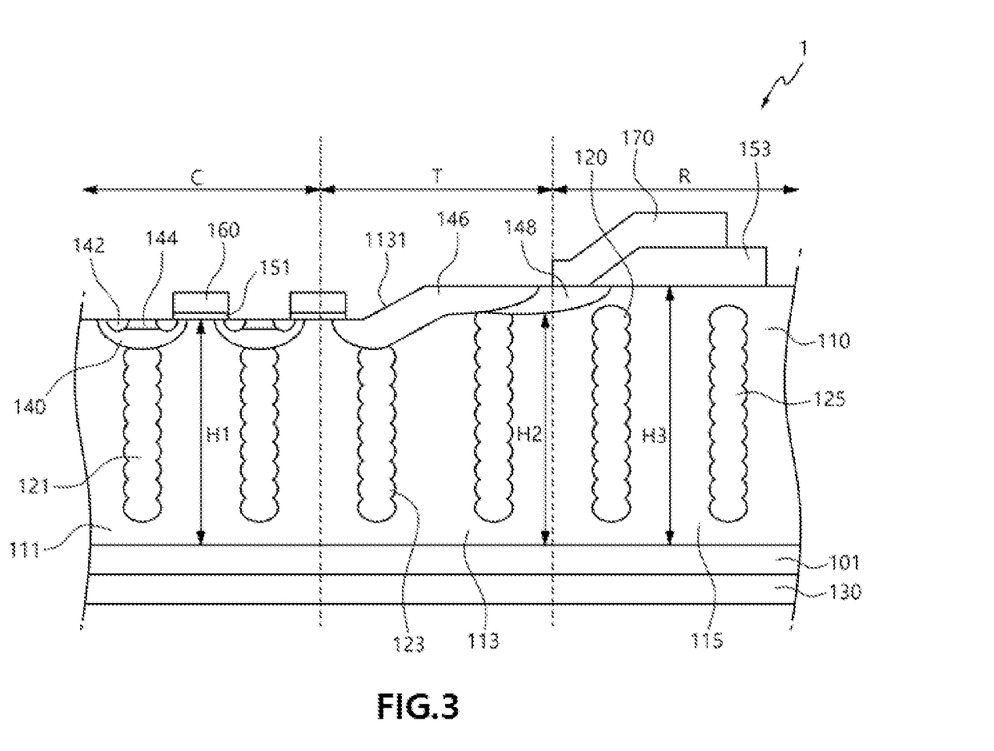
FIG. 3 is a cross-sectional view of a superjunction semiconductor device with different effective epitaxial layer thicknesses according to an embodiment of the present disclosure.

FIG. 3 is a cross-sectional view of a superjunction semiconductor device according to an embodiment of the present disclosure.

Hereinbelow, the superjunction semiconductor device according to the embodiment of the present disclosure will be described in detail with reference to accompanying drawings.

Referring to FIG. 3, the present disclosure relates to a superjunction semiconductor device 1 with different effective epitaxial layer thicknesses and a method of manufacturing the same and, more particularly, to a superjunction semiconductor device 1 and a method of manufacturing the same, the superjunction semiconductor device 1 having epitaxial layer thicknesses in a cell region C and a ring region R that are different from each other to decrease the breakdown voltage in the cell region C relative to the breakdown voltage in the ring region R. This allows the breakdown voltage of the cell region C to control UIS in the superjunction semiconductor device 1.

First, a substrate 101 is below or under the superjunction semiconductor device 1. The substrate 101 may include a silicon substrate, a germanium substrate, or a bulk wafer with an epi-layer (e.g., of silicon) thereon. Herein, the term "epi-layer" refers to an epitaxial layer or a part, portion or section thereof. For example, the substrate 101 may comprise a heavily-doped second conductive type substrate.

An epitaxial layer 110 may be on the substrate 101 over the cell region C, a transition region T, and the ring region R. For example, the epitaxial layer 110 may be lightly doped with a second conductive type dopant. For the convenience of the description, the epitaxial layer in the cell region C is referred to as a first epi-layer 111, the epitaxial layer in the transition region T is referred to as a second epi-layer 113, and the epitaxial layer the ring region R is referred to as a third epi-layer 115.

Furthermore, pillars 120 extend vertically over the substrate 101 in the epitaxial layer 110, and may include a plurality of pillars 120 horizontally spaced apart from each other. The pillars 120 may include a first conductive type dopant, and may be more heavily dopes than the epitaxial layer 110. For the convenience of the description, a pillar in the cell region C is referred to as a first pillar 121, a pillar in the transition region T is referred to as a second pillar 123, and a pillar in the ring region R is referred to as a third pillar 125. The epitaxial layer 110 and the pillars 120 alternate in a horizontal direction over the cell region C, the transition region T, and the ring region R. Contact surfaces (e.g., interfaces) between the epitaxial layer 110 and the pillars 120 may be curved and/or complementary in the drawings, but the present disclosure is not limited thereto, and the pillars 120 may extend in a vertical direction.

Furthermore, a drain electrode 130 is on a lowermost surface of the substrate 101. First conductive type body regions 140 having a predetermined depth may be respectively on the first pillars 121 in the first epi-layer 111 of the cell region C, and the first conductive type body regions 140 may extend in one direction. In other words, the first pillars 121 may be respectively connected to the body regions 140 in a one-to-one matching relationship. At least one second conductive type source 142 is in each of the body regions 140. The at least one source 142 may be heavily doped.

In one embodiment, two sources 142 are at left and right sides of each of the body regions 140, and current paths may be in the first epi-layer 111 at opposite sides of the first pillars 121. A first conductive type body contact 144 is adjacent to and/or in contact with the sources 142 in each of the body regions 140. The body contacts 144 may be heavily doped.

Next, a connection region 146 having a predetermined depth is on a plurality of second pillars 123 in the second epi-layer 113. The connection region 146 may extend in one or more directions. The connection region 146 connects the second pillars 123 in the transition region T to each other. The second pillars 123 in the transition region T share the connection region 146 together.

The connection region 146 includes a first conductive type dopant and has the same doping density as the body regions 140. Preferably, the connection region 146 is more heavily doped than each of the second pillars 123. Furthermore, a first conductive type well 148 is in the second epi-layer 113. The first conductive type well 148 extends from the connection region 146 to the ring region R. The well 148 has a doping density lower than that of the connection region 146. The well 148 provides a current path during reverse recovery (RR).

Furthermore, in the cell region C and the transition region T, a gate oxide film 151 may be on the first epi-layer 111, below a gate electrode 160, which will be described below. The gate oxide film 151 has an uppermost surface in contact with a lowermost surface of the gate electrode 160. In the ring region R, a field oxide film 153 may be on the third epi-layer 115 and below a floating electrode 170, which will be described below. Both the gate oxide film 151 and the field oxide film 153 comprise a silicon oxide film, a high-k dielectric film, or a combination thereof, and preferably formed by different processes.

The gate electrode 160 is on the gate oxide film 151, and a channel region is turned on and off by a voltage applied to the gate electrode. The floating electrode 170 is on the field oxide film 153 in the ring region R. The floating electrode 170 may be in the ring region R (i.e., a termination region) to serve as a field stop layer terminating an electric field. Both the gate electrode 160 and the floating electrode 170 may be formed simultaneously in one process. For example, both the gate electrode 160 and the floating electrode 183 may comprise a conductive polysilicon, a metal, a conductive metal nitride, a refractory metal silicide, or a combination thereof.

Figure 4:
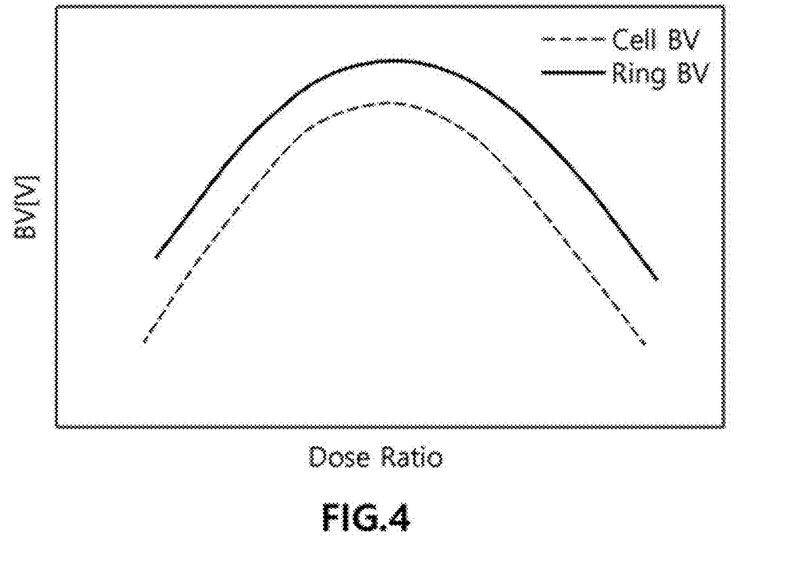
FIG. 4 is a graph showing breakdown voltages in the cell region and the ring region according to the dose ratio in the superjunction semiconductor device shown in FIG. 3.

FIG. 4 is a graph showing breakdown voltages in the cell region and the ring region according to the dose ratio (e.g., of the epitaxial layer) in the superjunction semiconductor device shown in FIG. 3.

Hereinbelow, the structure of the conventional superjunction semiconductor device 9 and the problem thereof, and the semiconductor device 1 according to the present disclosure for solving the problem of conventional superjunction semiconductor device 9 will be described.

Referring to FIG. 1, the conventional superjunction semiconductor device 9 an epitaxial layer 910 with a uniform thickness over the cell region C, the transition region T, and the ring region R. The first body regions 950 in the cell region C are connected to the pillars 930 in a one-to-one matching relationship, and a second body region 970 in the transition region T has a long shape in a transversal direction to connect the pillars 930 to each other. The pillars 930 in the transition region T share the second body region 970 together. Therefore, the effective thickness h2 of the epitaxial layer 910 in the transition region C is smaller than the effective thickness h1 of the epitaxial layer 910 in the cell region C.

In general, in the superjunction device, the breakdown voltage is determined by characteristics of the epitaxial layer 910 and the pillars 930, and unclamped inductive switching (UIS) may be stable when it is determined in the cell region C, which has a relatively larger area and provides a current path. However, when the breakdown voltage in the cell region and the breakdown voltage in the ring region are similar, variations in the breakdown voltage in the ring region may be a factor in diminishing or weakening the UIS (refer to FIG. 2). The revelation of the breakdown voltage in the ring region is caused by the effective thickness h2 of the epitaxial layer 910 in the transition region being smaller than the effective thickness h1 of the epitaxial layer 910 in the cell region, which can decrease the breakdown voltage in the ring region to a value less than the breakdown voltage in the cell region at a given dose ratio.

In order to solve the above problem, the semiconductor device 1 according to the present disclosure is configured to have different effective thicknesses for the first epi-layer 111 and the third epi-layer 115 (and optionally the second epi-layer 113). In detail, the first epi-layer 111 may extend toward the ring region R, similarly to the epitaxial layer 910 in the cell region C in the conventional semiconductor device. The first epi-layer 111 may have a uniform first thickness H1. The second epi-layer 113 may extend from the cell region C toward the ring region R, and the second epi-layer 113 may have an inclined surface 1131 that extends upward. The inclined surface 1131 of the second epi-layer 113 results in the second epi-layer 113 having a second thickness H2. In other words, the effective thickness of the second epi-layer 113 may be the same as or similar to (but is generally not less than) the first thickness H1 of the first epi-layer 111. Furthermore, since a separate body region or extension region is not in the third epi-layer 115, a third thickness H3 (i.e., the effective thickness of the third epi-layer 115), is greater than the first thickness H1 and may be greater than the second thickness H2. For example, the first thickness H1 may mean a thickness of a portion of the first epi-layer 111 without the body region 140 (i.e., the thickness of the first epi-layer 111 minus the depth of the body region 140), the second thickness H2 may mean a thickness of a portion of the second epi-layer 113 under the well 148 (and optionally under the connection region 146), and the third thickness H3 may mean a thickness of the portion of the third epi-layer 115 under the well 148 (and optionally the entire thickness of the third epi-layer 115).

As described above, referring to FIG. 4, the breakdown voltage in the cell region C may always be less than the breakdown voltage in the ring region R, regardless of the dose ratio of the epitaxial layer. Therefore, as the breakdown voltage in the cell region C is reached, a stable breakdown voltage and UIS may be secured. Furthermore, although there are many design rule restrictions when a device design is changed to increase the breakdown voltage in the ring region relative to the breakdown voltage in the cell region, the structure according to the present disclosure is not restricted by such design rules, so the structure may be applied at a desired level.

FIGS. 5 to 10 are cross-sectional views showing a method of manufacturing the superjunction semiconductor device according to one or more embodiments of the present disclosure.

Hereinbelow, a method of manufacturing the superjunction semiconductor device with different effective epitaxial layer thicknesses according to the present disclosure will be described in detail with reference to the accompanying drawings. It should be noted that each step of forming various components may differ in time from the description, or multiple components may be formed simultaneously. Furthermore, the method of manufacturing the components is disclosed for illustrative purposes, but the scope of the present disclosure is not limited thereto.

Figure 5:
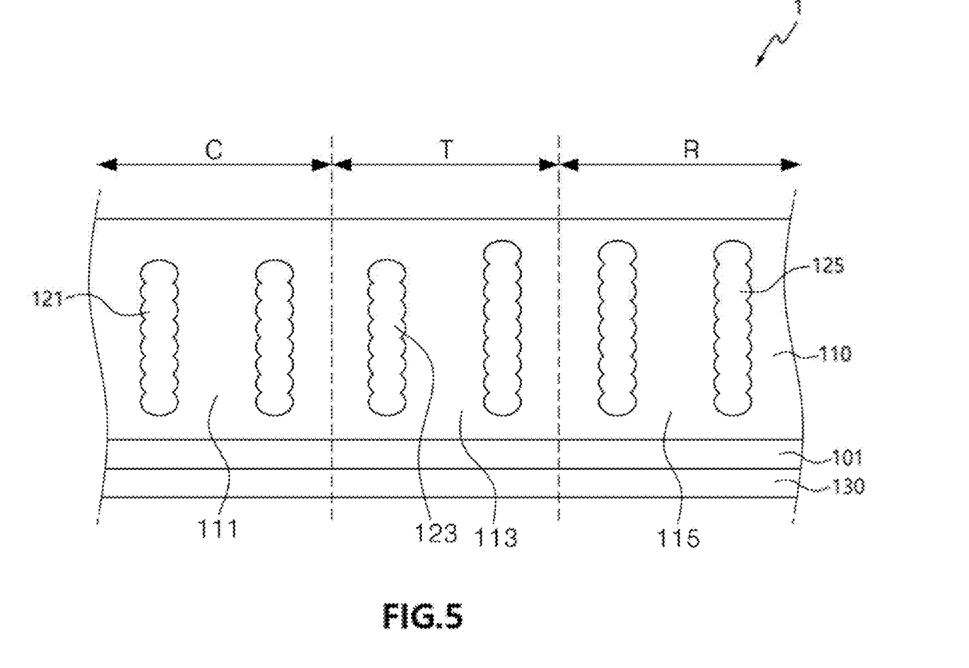
FIGS. 5 to 10 are cross-sectional views showing a method of manufacturing the superjunction semiconductor device with a different effective epitaxial layer thicknesses according to one or more embodiments of the present disclosure.

First, referring to FIG. 5, the second conductive type epitaxial layer 110 is formed on the substrate 101 in the cell region C, the transition region T, and the ring region R. For example, the epitaxial layer 110 may be formed by epitaxial growth. Then, one or more deep trenches (not shown) may be formed by photolithographic patterning and etching, extending from an uppermost surface of the epitaxial layer 110. A plurality of trenches (not shown) may be spaced apart from each other. For example, the trenches may be formed by an etching process in the presence of a mask pattern. The trenches are in the cell region C, the transition region T, and the ring region R. After the formation of the trenches, the mask pattern is removed. The pillars 120 may be formed in each of the trenches T. For example, a semiconductor material containing a first conductive type dopant is deposited into each of the trenches T and onto the epitaxial layer 110, and a CMP process is performed to expose the upper surface of the epitaxial layer 110. The semiconductor material remains in the trenches. In a further embodiment, the semiconductor material deposition process and the CMP process are repeatedly performed until the trench(es) are completely filled to provide the pillar 120.

Alternatively, a plurality of second conductive type epi-layers are successively stacked, and a first conductive type dopant is implanted into each epi-layer (e.g., between epi-layer growth cycles), and the pillar 120 may be formed by a diffusion process (e.g., heat processing or thermal annealing). Therefore, the first epi-layer 111, the first pillars 121, the second epi-layer 113, the second pillar 123, the third epi-layer 115 and the third pillars 125 are respectively in the cell region C, the transition region T, and the ring region R. However, the scope of the present disclosure is not limited to the above-described examples.

Figure 6:
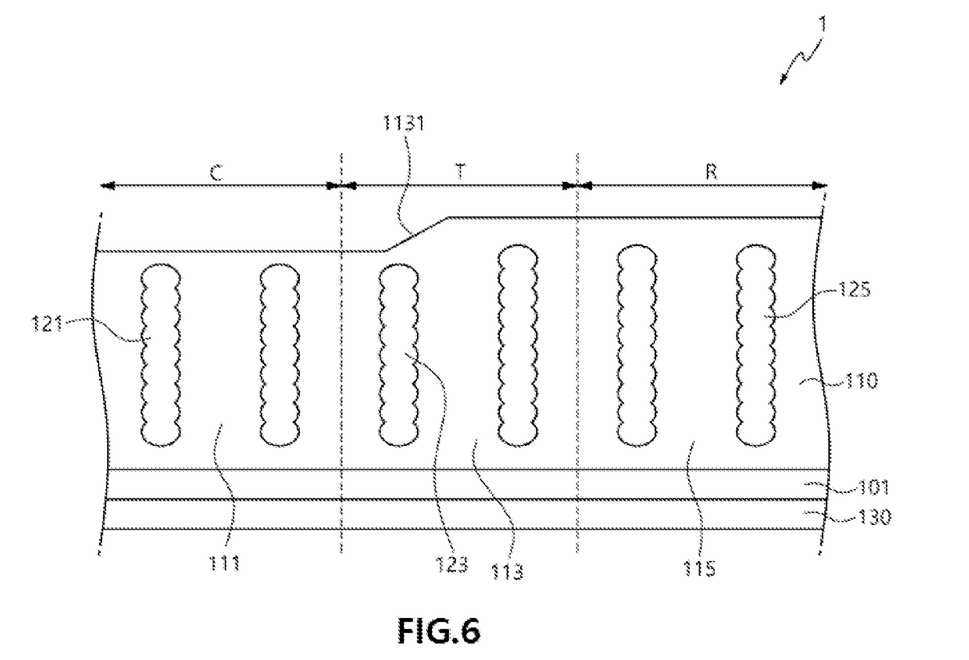

Referring to FIG. 6, a process of forming different effective thicknesses of the first epi-layer 111, the second epi-layer 113, and the third epi-layer 115 is performed. As a result, the effective thickness of the first epi-layer 111 and the effective thickness of the second epi-layer 113 may be the same or similar. In describing the process in detail, for example, the first epi-layer 111 in the cell region C is etched so that the uppermost surface of the first epi-layer 111 is lower than the uppermost surface of the second epi-layer 113. The first epi-layer 111 may be etched to a depth of from 50-2000 Å, or any depth or range of depths therein, although the description is not limited thereto. Alternatively, the first epi-layer 111 in the cell region C is oxidized. For example, oxidizing the first epi-layer 111 in the cell region C may cause an interfacial change in the first epi-layer 111. The oxidation may take place in the presence of a hard mask (e.g., silicon nitride on silicon dioxide) covering the transition region T and the ring region R. Thermal (e.g., wet or dry) oxidation of silicon also oxidizes the silicon under the edge of the hard mask closest to the exposed (oxidized) silicon, to a lesser extent. The amount of oxides forming in the silicon under the edge of the hard mask decreases as a function of the distance from the edge of the hard mask, resulting in a sloped interface between the silicon and the oxide. The oxide may be grown to a thickness of from 50-2000 Å, or any thickness or range of thicknesses therein, although the description is not limited thereto. The effective thickness H1 of the first epi-layer 111 may be smaller than the effective thickness H2 of the second epi-layer 113 after such an oxidation. Then, the oxide film is removed.

Figure 7:
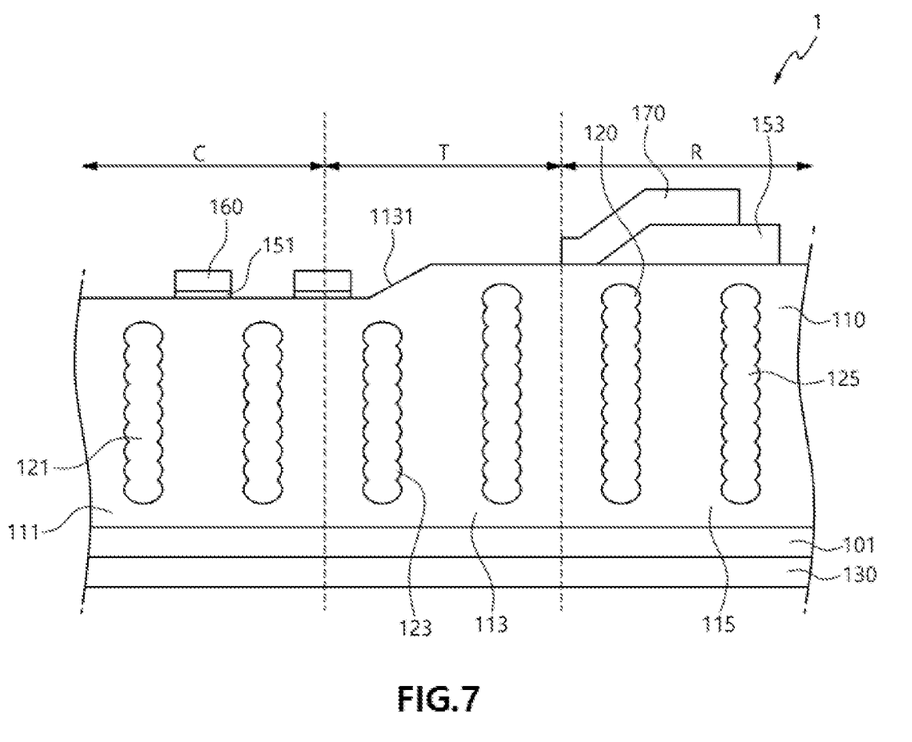

Referring to FIG. 7, the field oxide film 153 is formed. In detail, an insulator film (not shown) may be deposited on the epitaxial layer 110, and an etching mask may be formed on the third epi-layer 115 in the ring region R. The insulator film may be etched by wet etching or dry etching using the mask pattern to remove the insulator film from the cell region C and the transition region T. Removing the etching mask results in the field oxide film 153.

Then, one or more other insulator films (not shown) for the gate oxide film 151 on the first epi-layer 111 and the second epi-layer 113 are formed. After the formation of the other insulator layer(s), a polysilicon film (not shown) for providing the gate electrode 160 and the floating electrode 170 is deposited.

After a patterned mask is formed on the gate film, the polysilicon film and the insulation film(s) are sequentially etched to provide the gate electrode 160, the floating electrode 170, and the gate oxide film 151. The gate electrode 160 may have a stripe shape in the cell region C, and may be parallel to the first pillars 121 (e.g., in a plan view).

Figure 8:
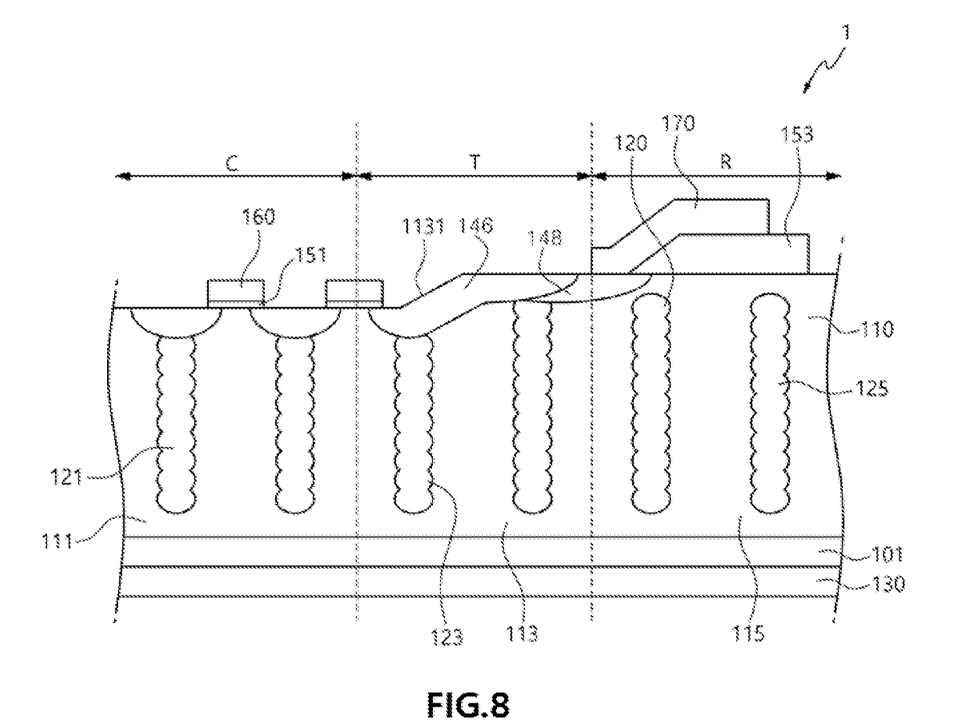

Referring to FIG. 8, the well 148 is provided. The well 148 may be formed by lightly doping (e.g., implanting or injecting) exposed areas in the transition region T with a first conductive type dopant in the presence of a mask covering at least the epi-layers in the cell region C and the ring region R. Portions of the gate electrode 160 and the floating electrode 170 may also serve as a mask, but the scope of the present disclosure is not limited thereto.

After the formation of the well 148, a first conductive type dopant is injected by ion implantation in the presence of a mask covering at least the epi-layers in the ring region R and in a peripheral part of the transition region T at the interface with the ring region R. The gate electrodes 160 in the cell region C and the transition region T may also serve as a mask. Thus, the body regions 140 and the connection region 146 may be formed.

Figure 9:
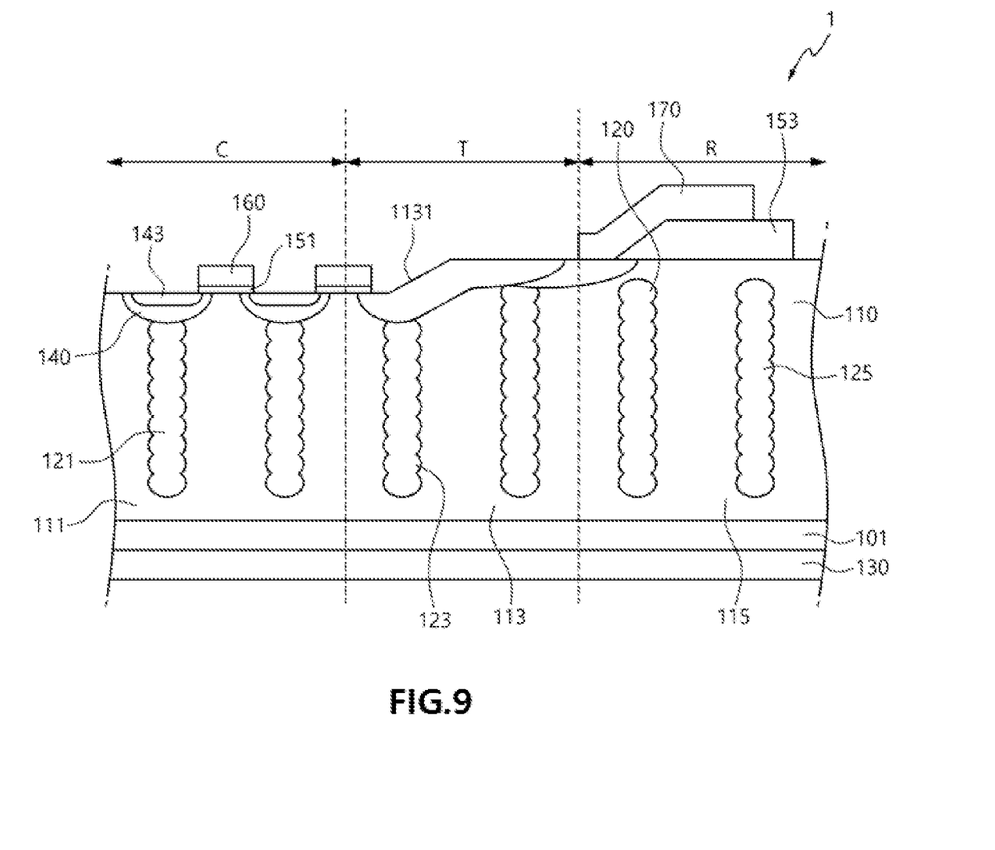

Referring to FIG. 9, the sources 142 are formed after the body regions 140. For example, the sources 142 may be formed by implanting a second conductive type dopant 143 into each of the body regions 140.

Figure 10:
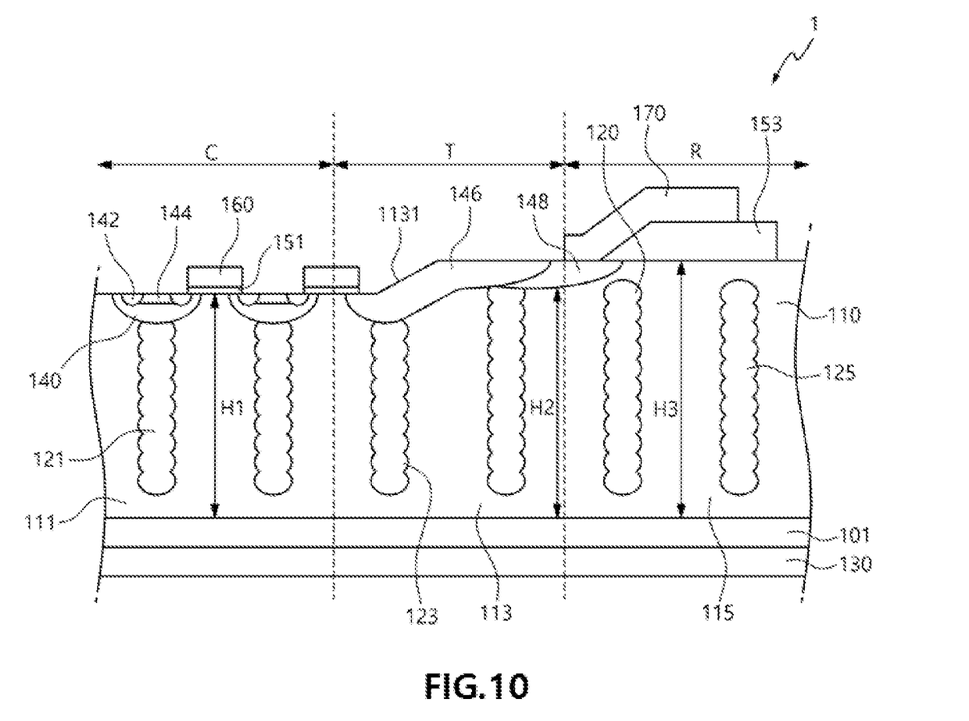

Referring to FIG. 10, a first conductive type dopant is injected into each of the body regions 140 in the presence of a mask to form the body contacts 144 in contact with or adjacent to the sources 142 as described above.

The detailed descriptions disclosed herein are only to illustrate the present disclosure. Furthermore, the foregoing is intended to represent and describe various embodiments of the present disclosure, and the present disclosure may be used in various other combinations, variations, and environments. Changes or modifications are possible within the scope of the concept of the invention disclosed herein, the scope equivalent to the written disclosure, and/or within the scope of skill or knowledge in the art. The above-described embodiments describe the best state for implementing the technical idea of the present disclosure, and various changes required in specific application fields and uses of the present disclosure are possible. Therefore, the detailed description of the above invention is not intended to limit the present disclosure to the disclosed embodiments.

What is claimed is:

1. A superjunction semiconductor device, comprising:
a second conductive type epitaxial layer comprising a first epi-layer in a cell region, a second epi-layer in a transition region, and a third epi-layer in a ring region;
first conductive type pillars comprising first pillars in the cell region, second pillars in the transition region, and third pillars in the ring region, and alternating with portions of the epitaxial layer;
first conductive type body regions in the first epi-layer, respectively connected to the first pillars; and
a first conductive type connection region in the second epi-layer, connected to the second pillars,
wherein the first epi-layer has a substantially flat uppermost surface, the second epi-layer has an inclined surface extending upward from the cell region to the ring region, and the third epi-layer has a substantially flat uppermost surface.

2. The superjunction semiconductor device of claim 1, further comprising:
a first conductive type lightly doped well connected to the connection region in the second epi-layer, the well extending to the third epi-layer adjacent thereto.

3. The superjunction semiconductor device of claim 1, further comprising:
a second conductive type source in each of the body regions; and
a first conductive type body contact and/or in contact with adjacent to the source in each of the body regions.

4. The superjunction semiconductor device of claim 1, further comprising:
a gate oxide film on the first epi-layer;
a gate electrode on the gate oxide film;
a field oxide film on the third epi-layer; and
a floating electrode on the field oxide film.

5. The superjunction semiconductor device of claim 1, wherein a first effective thickness of the first epi-layer and a second effective thickness of the second epi-layer are substantially equivalent, and a third effective thickness of the third epi-layer is greater than the first effective thickness of the first epi-layer.

6. The superjunction semiconductor device of claim 1, wherein the first epi-layer has an effective thickness less than an effective thickness of the third epi-layer.

7. The superjunction semiconductor device of claim 1, wherein the second epi-layer has an effective thickness substantially equivalent to the effective thickness of the first epi-layer.

* * * * *